(12) United States Patent
Tseng

(10) Patent No.: US 8,340,320 B2
(45) Date of Patent: Dec. 25, 2012

(54) MUTE CIRCUITS

(75) Inventor: Chao-Wei Tseng, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 715 days.

(21) Appl. No.: 12/277,438

(22) Filed: Nov. 25, 2008

(65) Prior Publication Data

US 2010/0128886 A1     May 27, 2010

(51) Int. Cl.
*H04R 3/02* (2006.01)
(52) U.S. Cl. ...................................... 381/94.5; 381/73.1
(58) Field of Classification Search .................. 381/94.5, 381/73.1
See application file for complete search history.

(56) References Cited

U.S. PATENT DOCUMENTS

| | | | |
|---|---|---|---|
| 6,016,352 A * | 1/2000 | Barmore | 381/94.5 |
| 7,787,639 B2 * | 8/2010 | Mi et al. | 381/94.5 |
| 2007/0154034 A1 * | 7/2007 | Mi et al. | 381/94.5 |

FOREIGN PATENT DOCUMENTS

| | | | |
|---|---|---|---|
| TW | 2007-27722 A | * | 7/2007 |
| TW | 200727722 A | | 7/2007 |

OTHER PUBLICATIONS

English Abstract translation of TW200727722A (published Jul. 16, 2007).

\* cited by examiner

*Primary Examiner* — Zandra Smith
*Assistant Examiner* — Paul Patton
(74) *Attorney, Agent, or Firm* — McClure, Qualey & Rodack, LLP

(57) ABSTRACT

Mute circuits capable of eliminating audible noise when the audio system is powered up and powered down are disclosed. A discharge element is coupled between an audio processing unit and an audio output unit in an audio system and a mute control unit is coupled to the discharge element. The mute circuit comprises an active element comprising a control terminal coupled to at least one power voltage at a power terminal of a functional element in the audio processing unit through a capacitor and turning on, by AC capacitor coupling, to drive the discharge element when the audio system is powered up, such that the discharge element is turned on to discharge an output current of the audio processing unit to a ground terminal, thereby muting the audio output unit to eliminate audible noise.

29 Claims, 5 Drawing Sheets

MUTE CIRCUITS

BACKGROUND OF THE INVENTION

1. Field of the Invention

The invention relates to a mute circuit, and in particular to a mute circuit capable of eliminating audible noise in audio system when the audio system is powered up and powered down.

2. Description of the Related Art

Generally, purchasers of high quality home and portable audio systems expect improved audio performance, as well as more options for controlling playback from the given recording media. One of the most important performance criteria is the elimination of clicks, pops, noise and other artifacts audible to the user. Not only are these audible artifacts distracting, but can also damage the system speakers or headset. This is especially true with transient artifacts, such as clicks and pops, which may spike the output signal driving the speakers or headset to a relatively high level.

In a typical audio system, the loads (e.g., the speakers or headset) are AC coupled to an audio integrated circuit sourcing electrical analog audio signals through a coupling capacitor. The normal quiescent output node voltage is roughly ½ of the power supply voltage. However, before power is supplied to the circuit, the output node voltage at the coupling capacitors is zero volts. Subsequently, when the circuit is powered up, the output node voltage transitions from zero volts to the quiescent voltage, thereby charging the coupling capacitors. This voltage transition can generate an audible sound in the speakers or headset, typically called a "pop." A "pop" can also occur when the system powers down and when the output nodes transition from quiescent voltage to zero volts.

Thus, improved circuits and methods for eliminating audible noise are needed.

BRIEF SUMMARY OF THE INVENTION

A detailed description is given in the following embodiments with reference to the accompanying drawings.

Embodiments of a mute circuit are provided, in which a discharge element is coupled between an audio processing unit and an audio output unit in an audio system, and a mute control unit turns on the discharge element to discharge an output current from the audio processing unit to a ground terminal before the audio system is powered down, thereby preventing audible noise, when receiving a voltage detection signal indicating that the audio system is to be powered down.

The invention provides another embodiment of a mute circuit, in which a discharge element is coupled between an audio processing unit and an audio output unit in an audio system and a mute control unit is coupled to the discharge element. The mute circuit comprises an active element comprising a control terminal coupled to at least one power voltage at a power terminal of a functional element in the audio processing unit through a capacitor and turning on, by AC capacitor coupling, to drive the discharge element when the audio system is powered up, such that the discharge element is turned on to discharge an output current of the audio processing unit to a ground terminal, thereby muting the audio output unit to eliminate an audible noise.

The invention provides another embodiment of an electronic device comprising an audio processing unit, an audio output unit coupled to an output terminal of the audio processing unit; and a mute circuit muting the audio output unit. In the mute circuit, a discharge element is coupled between the audio processing unit and the audio output unit, and the mute control unit drives the discharge element to discharge an output current of the audio processing unit to a ground terminal when the electronic device is powered up or receiving a voltage detection signal indicating that the audio system is to be powered down. The mute control unit comprises a first transistor comprising a control terminal coupled to at the least one power voltage at a power terminal of the audio processing unit through a first capacitor and turning on to drive the discharge element by AC capacitor coupling when the electronic device is powered up.

The invention provides another embodiment of a method for eliminating audible noise, in which power voltage is collated by diodes and provided to a control terminal of an active element by AC capacitor coupling when an audio system is powered up, thereby turning on the active element, and a discharge element is turned on to discharge an output current of an audio processing unit in the audio system ground terminal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
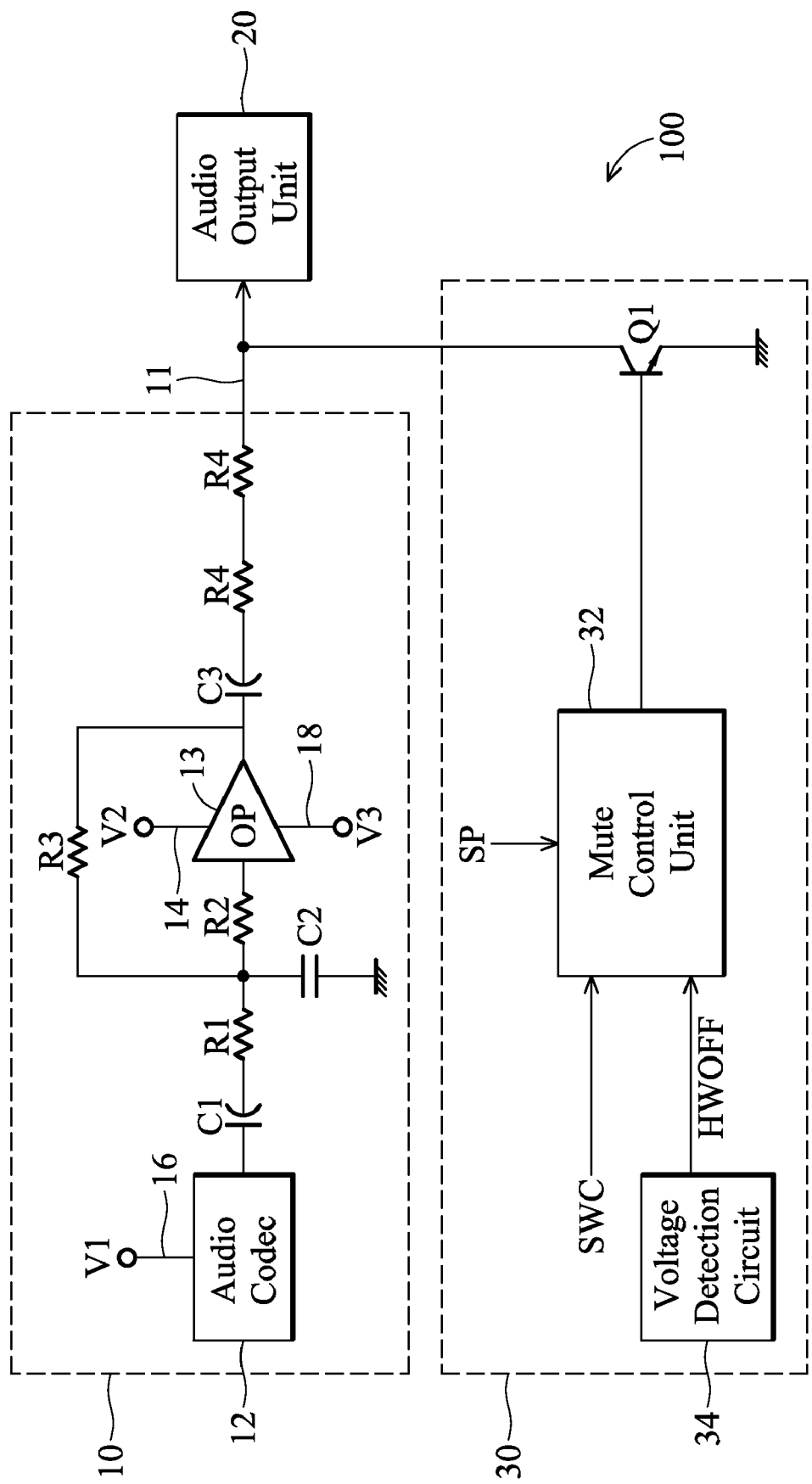
FIG. 1 schematically shows an embodiment of an audio system.

FIG. 1 schematically shows an embodiment of an audio system for generating audio signals, implemented here as an electronic device 100, comprising an audio processing unit 10, an audio output unit 20 and a mute circuit 30. The electronic device 100 may be a digital video recorder (DVR), a DVD player, a television, a computer, an audio player, etc. The audio processing unit 10 processes audio information and enables the audio output unit 20 to output accordingly. The audio processing unit 10 comprises an audio coder/decoder (CODEC), an operational amplifier 13, resistors R1~R4 and capacitors C1~C3. The audio CODEC 12 performs A/D conversion on transmission audio information, codes the information, decodes the received audio information, and performs D/A conversion in accordance with the audio signal coding/decoding algorithm provided by the instruction from a system control unit (not shown). The operational amplifier 13, resistors R1~R4 and capacitors C1~C3 form an amplification circuit to amplify the output of the audio CODEC 12 and enables the audio output unit 20 to sound accordingly.

The audio CODEC 12 has a power terminal 16 coupled to a power voltage V1, such as +5VSTB, and the operational amplifier 13 has a positive power terminal 14 coupled to a power voltage V2, such as +12VSTB and a negative power terminal 18 coupled to a power voltage V3, such as −5VSTB. For example, the power voltages V1~V3 can be provided by a power board (not shown), and the power board detects the condition of the power voltages and provides a power identification signal, i.e., a power good signal, indicating the conditions of the power voltages. When the condition of power voltages on the power board is normal, for example, input voltages of the power board are ready, the power board outputs the power good with a first logic state, such as HIGH. On the contrary, when the condition of power voltages on the power board is abnormal, for example, input voltages of the power board are not ready or the AC power voltage of the power board is going to be turned off, the power board outputs the power good with a second logic state, such as LOW.

The audio output unit 20 outputs according to the output 12 of the audio processing unit 10. For example, the audio output unit 20 can be a speaker or a handset but is not limited thereto. The mute circuit 30 is coupled to the output terminal 11 of the audio processing unit 10, discharging an output current of the output terminal 11 to the ground terminal GND when the electronic device 100 (i.e., the audio system) is powered up and powered down, thereby eliminating audible noise, such as pop noise. The mute circuit 30 comprises a discharge element Q1, a mute control unit 32 and a voltage detection circuit 34. In this embodiment, the discharge element Q1 is a bipolar junction transistor but is not limited thereto. For example, the discharge element Q1 can be another type of active element.

The mute control unit 32 drives the discharge element to discharge an output current of the audio processing unit to a ground terminal when the electronic device 100 is powered up or receiving a voltage detection signal indicating that the electronic device 100 is to be powered down, or a software mute control signal controlled by a program, thereby preventing audible noise. For example, when the electronic device is powered up, the mute control unit 32 collates at least one power voltage SP of the electronic device 100 by diodes and provides the collated power voltage to drive a control terminal of an active element by AC coupling of a capacitor, such that the discharge element Q1 is turned on quickly to discharge the output current of the audio processing unit 10 and the audio output unit 20 is muted accordingly. In some embodiments, the power voltage SP can be a power voltage at a power terminal of a functional element, such as the audio CODEC 12 or the operational amplifier 14, in the audio processing unit 10, but not limited thereto, it can also be an earliest pulled-up power voltage in the electronic device 100.

The voltage detection circuit 34 detects at least power voltages of the electronic device 100 to determine whether the electronic device 100, i.e., the audio system, is to be powered down. For example, the voltage detection circuit 34 outputs a voltage detection signal HWOFF indicating that the electronic device 100 is to be powered down when the power voltage, such as V1, V2 or V3, of the electronic device 100 is less than a predetermined level, such that the mute control unit 32 turns on the discharge element Q1 to discharge the output current on the output terminal 11, thereby eliminating audible noise when the electronic device 100 is powered down.

In addition, the voltage detection circuit 34 can be a power detection integrated circuit detecting at least one power voltage, such as V1, V2 or V3, of the electronics device 100, i.e., the first power voltage at the positive power terminal 14 of the operational amplifier 13 or the power voltage V1 at the power terminal 16 of the audio CODEC 12. As the detected power voltage in the electronic device 100 is lowered below a predetermined voltage level, the power detection integrated circuit outputs the voltage detection signal HWOFF, such as a low level signal, to the cathode of the diode D5. Hence, the diode D5 is turned on to pull the base terminal of the transistor Q3 low and thus, the mute circuit 30 mutes the audio output unit 20 again. Similarly, the voltage detection circuit 34 can also be a comparator or a voltage-divided circuit, but is not limited thereto, with operations thereof similar to those of the power detection IC and thus, omitted for simplification.

In some embodiments, the voltage detection circuit 34 can be omitted, and the voltage detection signal can be the power identification signal, i.e., power good signal, of the power board and received through the GPIO terminal. For example, when the condition of power voltages on the power board is normal, such as input voltages of the power board are ready, the power board outputs the power good with a first logic state, such as HIGH. On the contrary, when the condition of power voltages on the power board is abnormal, such as input voltages of the power board are not ready or the AC power voltage of the power board is going to be turned off, the power board outputs the power good with a second logic state, such as LOW. Namely, when the power board detects the electronic device 100 is going to be powered down, the electronic device 100 outputs the power identification signal, such as power good signal, with low logic level to the diode D5. Hence, the diode D5 is turned on to pull low the base terminal of the transistor Q3 and thus, the mute circuit 32 mutes the audio output unit 20 again.

Because the mute control unit 32 can turn on the discharge element Q1 to discharge the output current on the output terminal 11 when the electronic device 100 is powered up or is to be powered down, audible noise, such as popping, can be prevented.

Figure 2:
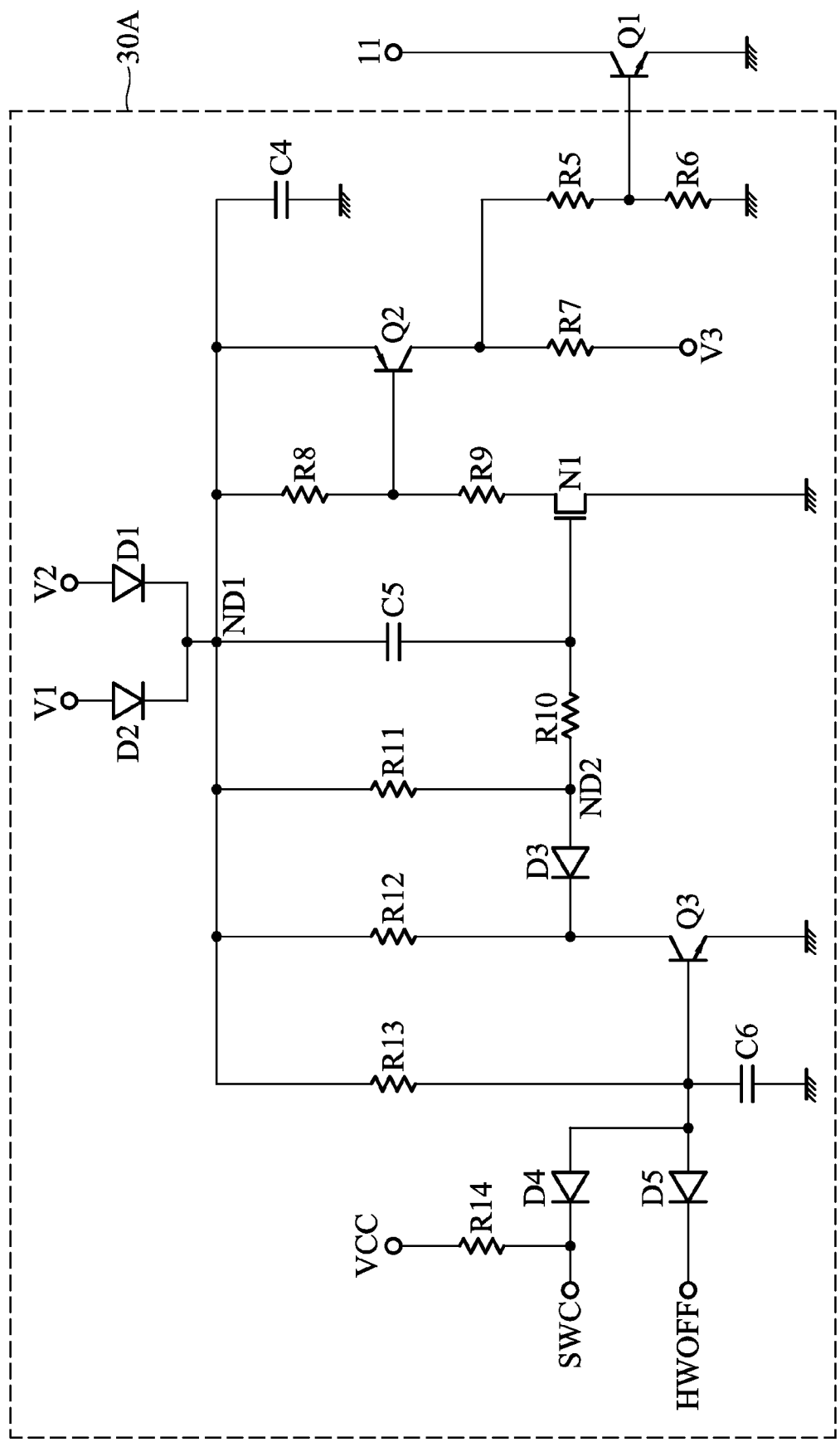
FIG. 2 shows an embodiment of a mute circuit.

FIG. 2 shows an embodiment of a mute circuit. As shown, the mute circuit 30 comprises resistors R5~R14, capacitors C4~C6, diodes D1~D5, bipolar junction transistors Q1~Q3 and a MOS transistor N1. The diodes D1 and D2 serve as a power voltage collection unit, anodes thereof are coupled to the power voltage V2 at the power terminal 14 of the operational amplifier 13 and the power voltage V1 at the power terminal 16 of the audio CODEC 12 respectively, and cathodes thereof are coupled to a node ND1. As the voltages V1 or V2 exceeds the threshold voltage of the diodes D1 and D2, the diodes D1 and D2 are turned on, and thus, the power voltage V1 or/and V2 is coupled to the node ND1.

The resistors R5~R9, the transistor Q2, and the capacitors C4 serve as a driving stage. The resistor R5 is coupled between a base terminal of the transistor Q1 and the collator terminal of the transistor Q2, the resistor R6 is coupled between the base terminal of the transistor Q1 and the ground terminal GND, and the resistor R7 is coupled between the collator terminal of the transistor Q1 and the power voltage V3 at the negative power terminal 18 of the operational amplifier 13. The transistor Q4 comprises an emitter terminal coupled to the node ND1, a base terminal coupled to the resistors R8 and R9, and a collator terminal coupled to the resistors R5 and R7. The capacitor C4 is coupled between the node ND1 and a ground terminal GND, and the resistor R8 is coupled between the node ND1 and the base terminal of the transistor Q2. The transistor Q2 is turned on to drive the transistor Q1 when a voltage across the resistor R8 exceeds the threshold voltage of the transistor Q2.

The MOS transistor N1, the resistors R10 and R11 and the capacitor C5 serve as driving control unit. The MOS transistor N1 comprises a first terminal coupled to the resistor R9, a second terminal coupled to the ground terminal, and a control terminal coupled to the capacitor C5 and the resistor R10. The capacitor C5 is coupled between the node ND1 and a control terminal of the MOS transistor N1, the resistor R10 is coupled between the control terminal of the MOS transistor N1 and a node ND2, and the resistor R11 is coupled between the nodes ND1 and ND2. As the diode D1 and/or D2 is turned on, the power voltage V2 at the positive power terminal of the operational amplifier 13, or the power voltage V1 at the power terminal 16 of the audio CODEC 12 is coupled to the control terminal of the MOS transistor N1 by capacitor coupling, such that the MOS transistor N1 is turned on. For example, due to AC coupling of the capacitor C5, the voltage on the control terminal of the MOS transistor N1 followers the power voltage V1 or V2 at the power terminal 16 or 14 when the electronic device 100 is powered up. As the MOS transistor N1 is turned on, the transistor Q2 is turned on and thus, the transistor Q1 is turned on accordingly.

The resistors R12~R13, the transistor Q3 and the capacitor C6 serve as a recovery unit. The diode D3 is coupled between the driving control unit and the recovery, and comprises an anode coupled to the node ND2 and a cathode coupled to a collator terminal of the transistor Q3. The transistor Q3 comprises a collator terminal coupled to the cathode of the diode D3, an emitter terminal coupled to the ground terminal GND, and a base terminal coupled to the resistor R13 and the capacitor C6. The resistor 12 is coupled between the node ND1 and the cathode of the diode D3, the resistor R13 is coupled between the node ND1, and the capacitor C6 is coupled between the base terminal of the transistor Q3 and the ground terminal GND.

When electronic device 100 is powered up, the diode D1 and/or D2 is turned on and capacitor C6 is charged by the power voltage V1 or V2 of the audio processing unit 10. After a time interval, the voltage stored capacitor C6 exceeds the threshold voltage of the transistor Q3, and the transistor Q3 is turned on such that the cathode of the diode D3 is pulled to the ground terminal, the diode D3 is turned on. Thus, the MOS transistor N1 is turned off, such that the mute circuit 30A stops muting the audio output unit 20. Namely, the mute control unit 32 turns off the discharge element Q1 after the discharge element Q1 is turned on for a predetermined time interval. In some embodiments, the predetermined time interval may exceed 3 seconds to eliminate audible noise.

The diode D4 is coupled between the base terminal of the transistor Q3 and a signal SWC, and comprises an anode coupled to the base terminal of the transistor Q3 and the capacitor C6, and a cathode coupled to the resistor R14 and the signal SWC. For example, the signal SWC can be a signal from a general purpose input/output (GPIO) terminal and controlled by software or an application program. For example, as the software or applicant program requests to mute the electronics device 100, it outputs the signal SWC with a low voltage level, such that the transistor Q3 is turned off and the MOS transistor N1 is turned on accordingly. Hence, the mute circuit 30A mutes the audio output unit 20 again.

The diode D5 is coupled between the base terminal of the transistor Q3 and the voltage detection signal HWOFF from the voltage detection circuit 40, and comprises an anode coupled to the base terminal of the transistor Q3 and the capacitor C6, and a cathode coupled to the resistor R14 and the voltage detection signal HWOFF. When receiving the voltage detection signal HWOFF indicating that the electronic device 100, i.e., audio system, is to be powered down from the voltage detection circuit 34 or a power board (not shown), i.e. a signal with low voltage level, the diode D5 is turned on to pull low the base terminal of the transistor Q3 and thus, the mute circuit 32 mutes the audio output unit 20 again.

Figure 3:
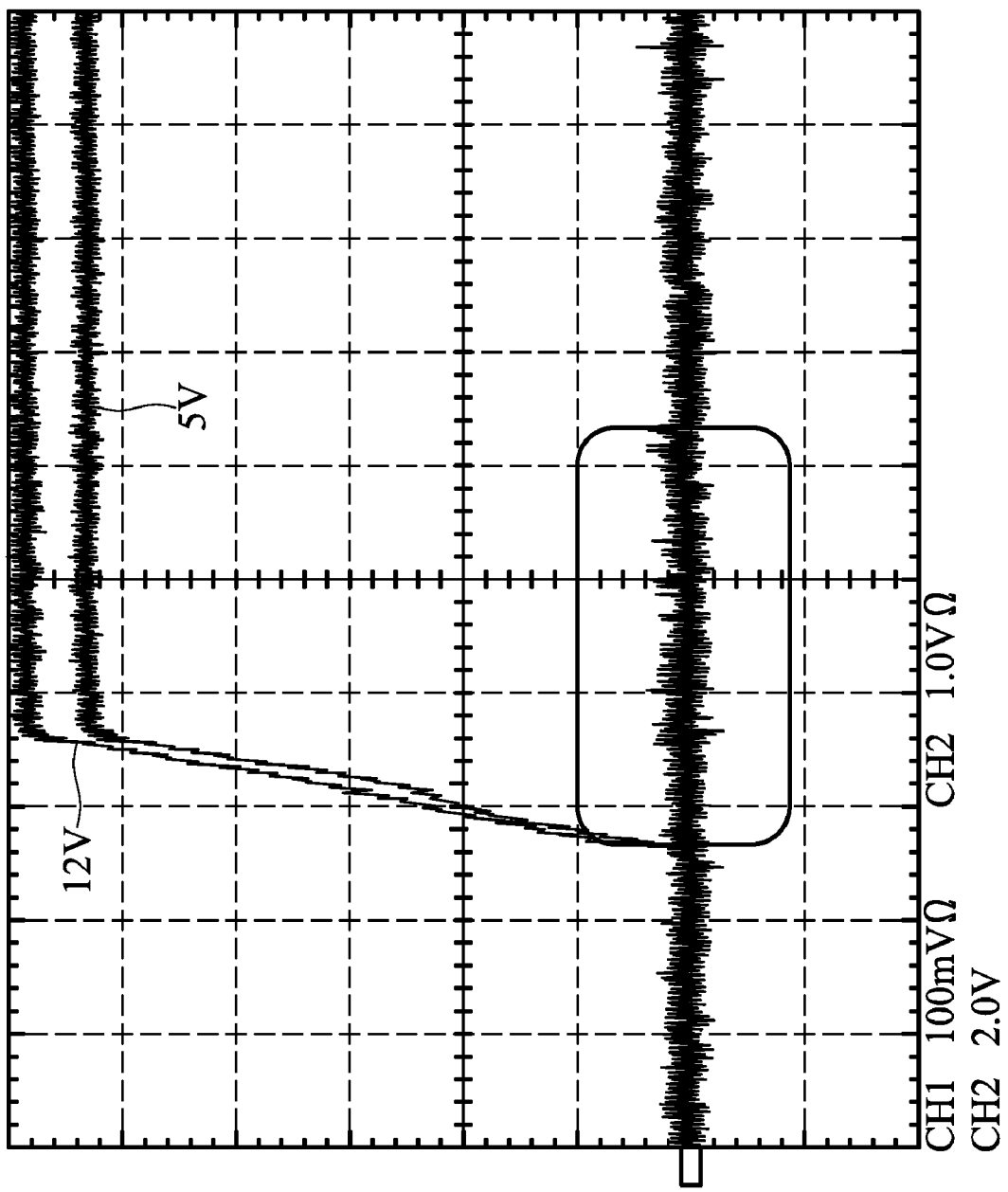
FIG. 3 shows simulated results of the output of the audio output unit when the electronic device is powered up.

Because the capacitor C5 serves as a short-circuit by AC coupling when the electronic device 100 is powered up, the voltage level at the control terminal of the MOS transistor N1 follows the earliest pulled-up power voltage, such as V1 or V2, in the electronic device 100, thereby turning on the MOS transistor N1 to mute the audio output unit 20 before functional elements, such as the audio CODEC 12 or the operational amplifier 14 are turned on. Hence, pop noise occurring when the electronic device 100 is powered up can be eliminated. FIG. 3 shows simulated results of the output of the audio output unit when the electronic device is powered up. As shown, no audio popping occurs during power up.

Figure 4:
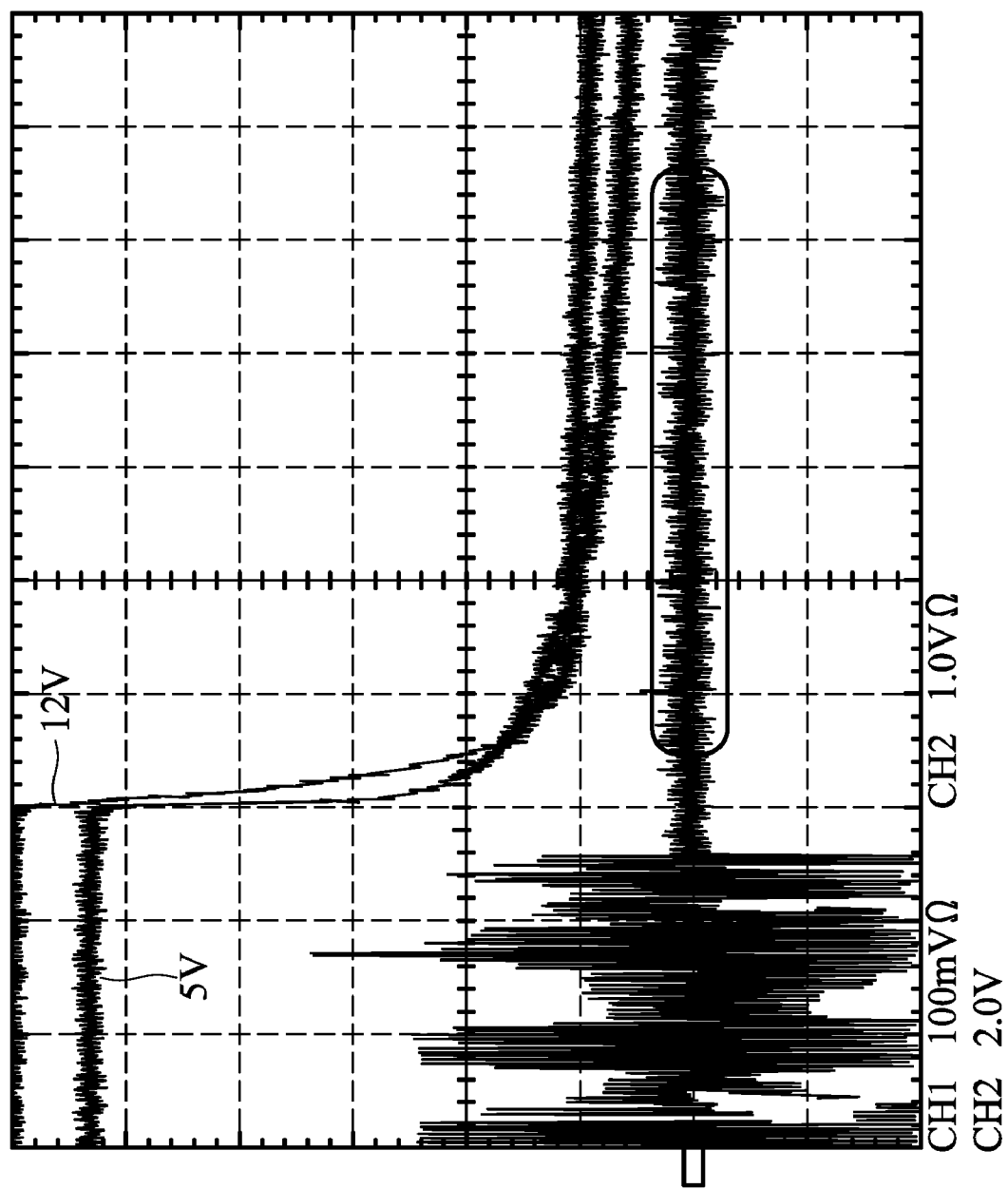
FIG. 4 shows simulated results of the output of the audio output unit when the electronic device is powered down.

Further, when the voltage detection signal HWOFF indicating the electronic device 100 is to be powered down is at low level, the diode D5 turned on to pull low the control terminal of the transistor Q3 such that the mute circuit 30 mutes the audio output unit 20. Hence, popping occurring when the electronic device 100 is powered down can also be eliminated. FIG. 4 shows simulated results of the output of the audio output unit when the electronic device is powered down. As shown, no audio popping occurs during power down. In additional, when the signal SWC controlled by software or an application program from a general purpose input/output (GPIO) terminal is at low level, the diode D4 turned on to pull low the control terminal of the transistor Q3 such that the mute circuit 30 mutes the audio output unit 20.

Figure 5:
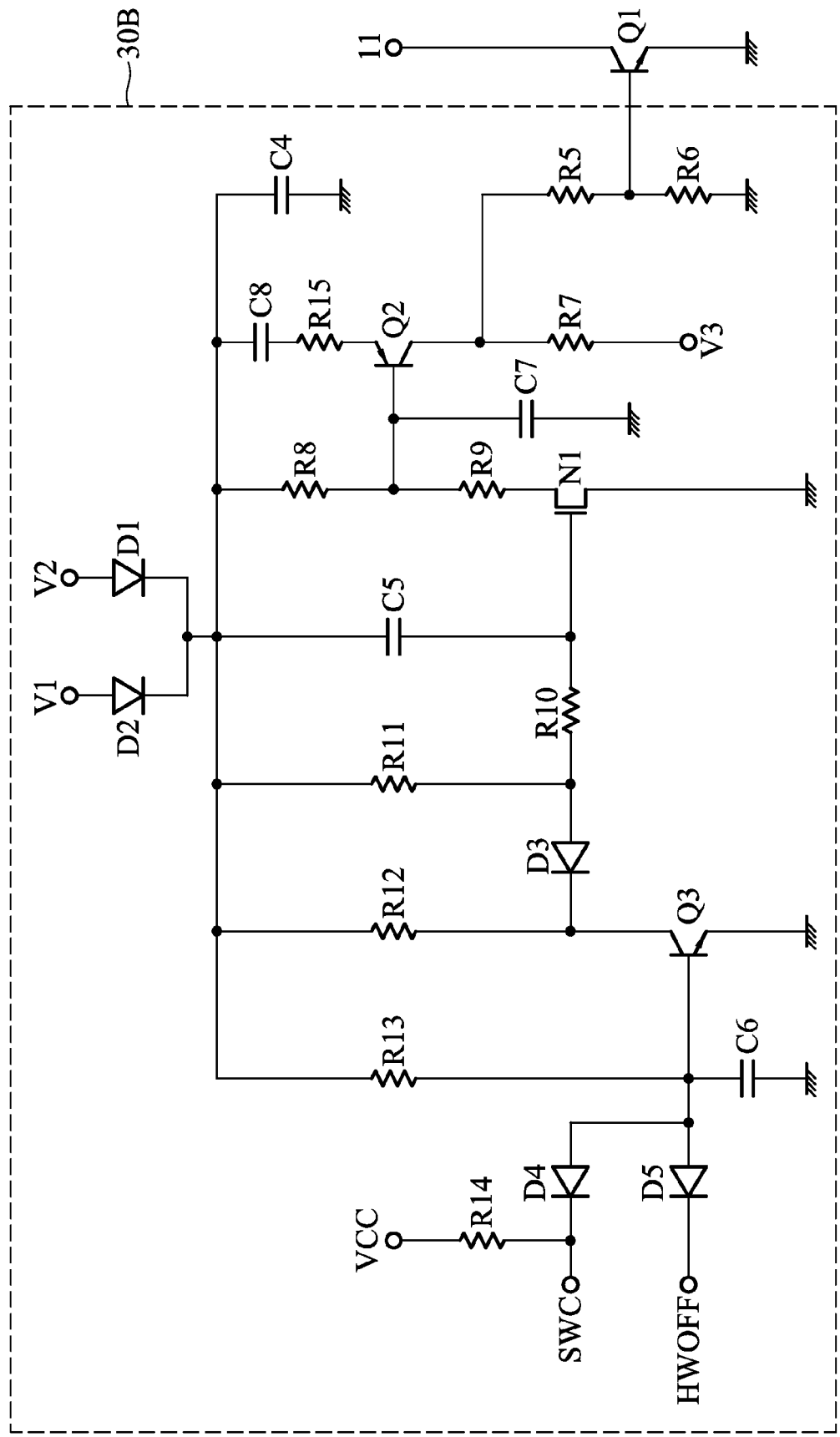
FIG. 5 shows another embodiment of a mute control unit.

FIG. 5 shows another embodiment of a mute control unit. As shown, the mute control unit 30B is similar to the mute control unit 30A shown in FIG. 2, differing only in that a capacitor C7 is coupled between the base terminal of the transistor Q2 and a capacitor C8 and a resistor R15 is connected in series between the node ND1 and the emitter terminal of the transistor Q2. Due to the presence of capacitors C7 and C8 and the resistor R15, when the electronic device 100 is powered up, the transistor Q2 can be turned on faster to driving the discharge element Q1 than as shown in FIG. 2, thereby preventing from the pulled up speed of power voltage in the electronic device 100 is not faster enough.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mute circuit, comprising:
    a discharge element coupled between an audio processing unit and an audio output unit in an audio system; and
    a mute control unit turning on the discharge element to discharge an output current from the audio processing unit to a ground terminal before the audio system is powered down, when receiving a voltage detection signal indicating that the audio system is to be powered down, wherein the voltage detection signal is a power identification signal of a power board and is received through a general purpose input/output (GPIO) terminal.

2. The mute circuit as claimed in claim 1, further comprising a voltage detection circuit detecting at least one power voltage at a power terminal of an element in the audio system and outputting the voltage detection signal indicating that the audio system is to be powered off when a voltage level of the power voltage is lower than a predetermined level.

3. The mute circuit as claimed in claim 1, wherein the voltage detection circuit comprises a power detection integrated circuit, a comparator or a voltage-divided circuit.

4. The mute circuit as claimed in claim 1, wherein the audio output unit comprises a speaker or a handset.

5. The mute circuit as claimed in claim 1, wherein the mute control unit further turns on the active element to discharge the output current from the audio processing unit to the ground terminal when receiving a software mute control signal controlled by a program.

6. A mute circuit, comprising:
a discharge element coupled between an audio processing unit and an audio output unit in an audio system; and
a mute control unit coupled to the discharge element, comprising:
an active element comprising a control terminal coupled to at least one power voltage through a capacitor and turning on, by AC capacitor coupling, to drive the discharge element when the audio system is powered up, such that the discharge element is turned on to discharge an output current of the audio processing unit to a ground terminal, thereby muting the audio output unit to eliminate audible noises.

7. The mute circuit as claimed in claim 6, wherein the power voltage is an earliest pulled-up power voltage when the audio system is powered up.

8. The mute circuit as claimed in claim 6, wherein the mute control unit further comprises a recovery unit turning off the active element when the active element is turned on for a predetermined time interval.

9. The mute circuit as claimed in claim 6, wherein the mute control unit further turns on the discharge element to discharge the output current from the audio processing unit to the ground terminal when receiving a software mute control signal controlled by a program.

10. The mute circuit as claimed in claim 6, wherein the power voltage is a voltage at a power terminal of a functional element in the audio system.

11. The mute circuit as claimed in claim 7, wherein the functional element comprises an audio coder/decoder (CODEC).

12. The mute circuit as claimed in claim 7, wherein the functional element comprises an operational amplifier and the power voltage is a voltage at a positive power terminal of the operational amplifier.

13. An electronic device, comprising:
an audio processing unit;
an audio output unit coupled to an output terminal of the audio processing unit; and
a mute circuit muting the audio output unit, comprising:
a discharge element coupled between the audio processing unit and the audio output unit; and
a mute control unit driving the discharge element to discharge an output current of the audio processing unit to a ground terminal when the electronic device is powered up or receiving a voltage detection signal indicating that the electronic device is to be powered down, wherein the mute control unit comprises a first transistor comprising a control terminal coupled to at the least one power voltage at a power terminal of audio processing unit through a first capacitor and turning on to drive the discharge element by AC capacitor coupling when the electronic device is powered up.

14. The electronic device as claimed in claim 13, wherein the voltage detection signal is a power identification signal of a power board and is received through a general purpose input/output (GPIO) terminal.

15. The electronic device as claimed in claim 14, wherein the mute control unit further turns on the discharge element to discharge the output current from the audio processing unit to the ground terminal when receiving a software mute control signal controlled by a program.

16. The electronic device as claimed in claim 15, wherein the mute control unit further comprises a recovery unit turning off the first transistor after the first transistor is turned on for a predetermined time interval.

17. The electronic device as claimed in claim 16, wherein the mute circuit further comprises a voltage detection circuit detecting the power voltage of electronic device and outputting the voltage detection signal indicating that the electronic device is to be powered off when a voltage level of the power voltage is lower than a predetermined level.

18. The electronic device as claimed in claim 16, wherein the power voltage is an earliest pulled-up power voltage when the electronic device is powered up.

19. The electronic device as claimed in claim 16, wherein the audio processing unit comprises an audio coder/decoder (CODEC) and the power voltage is a voltage at a power terminal of the audio CODEC.

20. The electronic device as claimed in claim 16, wherein the audio processing unit comprises an operational amplifier and the power voltage is a voltage at a positive power terminal of the operational amplifier.

21. The electronic device as claimed in claim 16, wherein the mute control unit further comprises a diode coupled between the voltage detection signal and the recovery unit.

22. The electronic device as claimed in claim 16, wherein the mute control unit further comprises:
at least one diode coupled between the power voltage and a first node;
a driving stage coupled between the first transistor and the discharge element, turning on the discharge element when the first transistor is turned on.

23. The electronic device as claimed in claim 22, wherein the driving stage comprises:
a second transistor coupled between a control terminal of the discharge element and comprising a control terminal coupled to the first transistor.

24. The electronic device as claimed in claim 22, wherein the driving stage further comprises a second capacitor coupled between the ground terminal and the control terminal of the second transistor.

25. The electronic device as claimed in claim 22, wherein the driving stage further comprises a third capacitor and a first resistor connected in series between the first node and the second transistor.

26. The electronic device as claimed in claim 23, wherein the recovery unit comprises:
a third transistor coupled between a control terminal of the first transistor and the ground terminal;
a second capacitor coupled between the ground terminal and a control terminal of the third transistor; and
a first resistor coupled between the first node and the second capacitor.

27. A method for eliminating audible noise, comprising:
collating at least power voltage;
providing the power voltage to a control terminal of an active element by AC capacitor coupling when an audio system is powered up, thereby turning on the active element; and
turning on a discharge element to discharging an output current of an audio processing unit in the audio system a ground terminal.

28. The method as claimed in claim 27, further comprising turning off the discharge element after the discharge element is turned on for a predetermined time interval.

29. The method as claimed in claim 28, further comprising turning on the discharge element again to discharge the output current to the ground terminal when receiving a voltage detection signal indicating that the audio system is to be powered down.

* * * * *